United States Patent [19]

Herron et al.

[11] Patent Number: 4,786,674
[45] Date of Patent: Nov. 22, 1988

[54] DIFFUSION ISOLATION LAYER FOR MASKLESS CLADDING PROCESS

[75] Inventors: Lester W. Herron, Hopewell Junction; Ananda H. Kumar, Wappingers Falls; Robert W. Nufer, Hopewell Junction, all of N.Y.

[73] Assignee: International Business Machines Corp., Armonk, N.Y.

[21] Appl. No.: 817,634

[22] Filed: Jan. 10, 1986

Related U.S. Application Data

[62] Division of Ser. No. 666,954, Oct. 30, 1984, Pat. No. 4,582,722.

[51] Int. Cl.$^4$ .............................. C08K 3/36; C08K 3/22
[52] U.S. Cl. .................................... 524/315; 524/430; 524/559
[58] Field of Search ..................... 524/430, 315, 559

[56] References Cited

U.S. PATENT DOCUMENTS

| | | | |
|---|---|---|---|
| 4,046,586 | 9/1977 | Uhlmann et al. | 428/403 |
| 4,273,859 | 6/1981 | Mones et al. | 430/315 |
| 4,356,232 | 10/1982 | Tadokoro et al. | 427/128 |
| 4,411,956 | 10/1983 | Matsufuji et al. | 428/532 |
| 4,482,538 | 11/1984 | Davies | 106/193 J |
| 4,575,475 | 3/1986 | Nakayama et al. | 427/132 |
| 4,599,266 | 7/1986 | Nakayama et al. | 427/132 |

FOREIGN PATENT DOCUMENTS

| | | |
|---|---|---|
| 0016925 | 10/1980 | Fed. Rep. of Germany . |
| 0089559 | 9/1983 | Fed. Rep. of Germany . |
| 1554958 | 1/1969 | France . |

OTHER PUBLICATIONS

Binder Systems for Multilayer Glass–Ceramic Substrate by R. N. Master et al., IBM Technical Disclosure Bulletin, vol. 22, No. 4, Sep. 1979, p. 1542.
Electroplating of MLC Substrates Using a Nonprecious Metal Shorting Material by R. J. Kowalczyk, IBM Technical Disclosure Bulletin, vol. 22, No. 4, Sep. 1979, pp. 1439–1440.

Primary Examiner—Herbert J. Lilling
Attorney, Agent, or Firm—Ira David Blecker

[57] ABSTRACT

In a maskless metal cladding process for plating an existing metallurgical pattern, a protective layer is utilized to isolate those areas of underlying metallurgy on which additional metal plating is not desired. The layer acts as an isolation barrier to protect the underlying metallurgy from deposition and subsequent diffusion of the heavy metal overlay. The composition of the protective layer is selected as one having sufficient mechanical integrity to withstand process handling and support the gold overlay and having the thermal integrity to withstand the high temperatures reached during metal sputtering and diffusion processes. The isolation barrier layer has an organic component as a binder which thermally decomposes, either in a heating step before metal deposition or during the diffusion cycle, leaving no carbonaceous residue but leaving an inert, inorganic standoff to support the metal. After diffusion of the metal, the remaining inorganic standoff layer, overlying metal and any undiffused metal remaining on the non-patterned substrate is easily removed by a standard technique, such as ultrasonics.

4 Claims, 1 Drawing Sheet dent# DIFFUSION ISOLATION LAYER FOR MASKLESS CLADDING PROCESS This is a divisional of application Ser. No. 666,954 filed Oct. 30, 1984, now U.S. Pat. No. 4,582,722.

The subject invention relates to a method of depositing metal layers on to an existing metallurgy pattern on a supporting dielectric substrate. More particularly, it relates to coating metal on selected metal conductive patterns while leaving other metallurgy uncoated; all of said metal patterns being found on ceramic substrate carriers of the type employed for mounting semiconductor devices.

BACKGROUND OF THE INVENTION

The steps for fabricating multi-layer ceramic substrates for integrated circuit package assemblies are well-known. Generally, a paste or slurry is prepared combining ceramic particulates (e.g. alumina), a binder and solvent therefor. The paste is cast or doctor bladed into sheets which are then dried and sized. The dried sheets are subsequently punched to form via holes; and screened to provide metallurgy to fill the via holes. The sheets are then stacked, laminated and sintered. The sintered substrates can be employed for mounting semiconductor devices which are electrically connected to the internal circuitry of the substrate.

Electrical connection from an external power source to the internal circuitry of the substrate is made through input/output, I/O, pins mounted on the bottom of the substrate. Electrical connection on the top of the substrate must be made to the integrated circuit devices and among engineering change, EC, pads. It is necessary, therefore, to provide a relatively complex metallurgy to the substrate.

On the top surface of the substrate, there may be dozens of EC pads along with I/O pad patterns designated for mounting, perhaps, nine integrated circuit "chips". The chip mounting is generally done using a "flip-chip" orientation whereby the chips are mounted to the I/O pads on the substrate surface using a solder reflow or similar standard process. In order to achieve a good bond for the lead-tin solder, the chip mounting, I/O pad is frequently prepared with a thin coat of gold on a thin coat of nickel deposited over the molybdenum via metallurgy. U.S. patent application Ser. No. 359,469 of A. H. Kumar et al, assigned to assignee of the present invention, discusses a two-material metallization process applied to both the I/O and EC pads. Those teachings are herein incorporated by reference. As discussed therein, nickel has excellent adhesion to molybdenum and the subsequent thin flash layer of gold prevents oxidation of the nickel. In addition, the very thin coating of gold on the I/O pads allows for a good solder bond for chip mounting. A heavy concentration of gold on the I/O pads, however, could contaminate the lead-tin solder and result in poor adhesion. The nickel and gold-treated EC pads, on the other hand, require additional heavy plating with gold to allow for frequent and repeated changes in the wire bonding to the pads thereby accommodating testing, engineering changes and defect compensation.

The need to plate the conductive pad patterns, EC and I/O, differently is discussed in patent application Ser. No. 560,661, filed 12/12/83, now U.S. Pat. No. 4,526,859, of Christensen, et al, assigned to the assignee of the present invention and herein incorporated by reference. There, the use of photoresists as masking layers is discussed for use in obtaining a heavy metal, for example gold, coating on either only the EC pads or only the I/O pads. The use of resists as masks is well-known, as evidenced by the teachings in Japanese application No. 50-124930, publication No. 52-48992, Apr. 19, 1977 and in U.S. Pat. No. 3,957,552 of Ahn, et al. As in Christensen, et al, the references teach the application of a resist, selective exposure of the resist using an appropriate mask and development of the exposed resist forming a pattern and revealing the underlying surface intended to be metallized. Metallization of the entire surface follows whereby the metal layer is deposited on the unexposed resist and on the patterned underlying surface. Removal by float-away or etching techniques of the remaining resist with overlying metal results in a clean, metal-patterned surface.

Similarly, metal masks can be used by placing them in registration with the substrate and, essentially, screening through the mask. It is frequently difficult however to achieve registration of a pre-formed metal mask with a substrate which has undergone uneven shrinkage during sintering.

The method of depositing the metal may be one of many well-known techniques. The Christensen, et al reference utilizes dry deposition processes such as magnetron sputtering or ion plating, in gross, with photoresists in place. Indiscriminate deposition of metal over the entire surface may also be obtained by painting the metal (See: U.S. Pat. No. 3,741,735, Buttle), dipping the article in molten metal (See: U.S. Pat. No. 2,788,289 to Double), sputtering, evaporation techniques or vapor deposition (all well-known methods cited in U.S. Pat. No. 4,293,587 of Trueblood). In all of these processes, a subsequent resist patterning and metal etching step is required to remove excess metal from the substrate. Electroplating, such as is seen in IBM Technical Disclosure Bulletin, Vol. 22 No. 4, Sept. '79, page 1439 by Kowalczyk, is a metal deposition method which can insure specific application of overlying metal to the intended metal pattern by providing a conductive path to only those pads to be plated. Another known method of deposition requiring no masking step is the maskless cladding process described in U.S. Pat. No. 4,442,137 to Kumar. Therein, a blanket metal coating is deposited, by sputtering, vapor deposition or other known process, and subsequently heated to a temperature sufficient to cause the overlying, e.g. gold, coat to diffuse with the underlying metallurgy. At the same time as the metal-to-metal diffusion is occurring, the varying shrinkage rates of the substrate material and the overlying metal produce stresses sufficient to cause the metal deposited on the substrate to flake or spall and consequently be readily removable in a follow-up mechanical cleaning step, such as ultrasonic removal of the residue.

The deposition and diffusion, however, is nonselective and therefore causes the heavy overlying metal to diffuse and adhere to all of the metal interconnection pads, EC and I/O alike. As noted above, it is desirable to have a thick gold coating on the EC pads but *not* on the I/O, chip mounting, pads.

It is therefore an object of the present invention to provide a method for depositing metal onto a selected portion of a metallurgical pattern.

It is another object of the invention to provide an isolation barrier against metal deposition to a selected portion of a metallurgical pattern.

It is a further object of the invention to provide an isolation barrier for use in a maskless cladding operation.

It is still another object to provide an isolation barrier having the thermal integrity to withstand metal deposition temperatures and the mechanical and thermal integrity to support a metal overlay film during subsequent diffusion steps.

It is a final object to provide a substrate isolation barrier having the thermal and mechanical integrity to withstand necessary processing and being readily removable leaving no residue on the substrate.

SUMMARY OF THE INVENTION

These and other objects are achieved by the subject invention wherein a selected portion of the metallurgical pattern on a dielectric substrate is isolated from subsequent processing by a screened barrier layer comprised of a ceramic particulate paste having a polymer binder and a low vapor pressure solvent. The barrier layer is allowed to dry to expel the solvent and is baked in a reducing atmosphere to expel the polymer binder. The remaining inorganic layer, having no organic or carbonaceous residues, has sufficient strength to withstand the subsequent maskless cladding processing steps of metal deposition, diffusion and patterning to remove the metal from the non-metallic substrate areas. During "patterning", the barrier layer is also removed leaving a clean, selectively metallized surface.

BRIEF DESCRIPTION OF THE DRAWINGS

The invention will be detailed in the accompanying specification and drawings wherein.

DETAILED DESCRIPTION OF THE PREFERRED EMBODIMENT

Figure 1A:
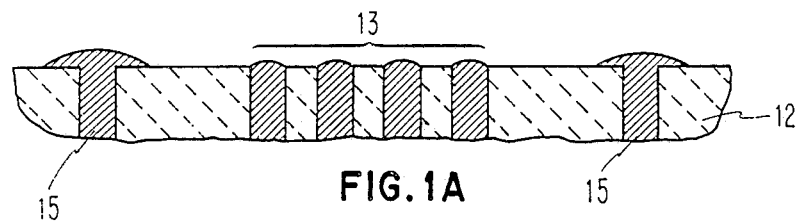
FIGS. 1A, B, C and D illustrate in substrate cut-away cross-section the processing steps involved in utilizing the subject invention.
Figure 1B:
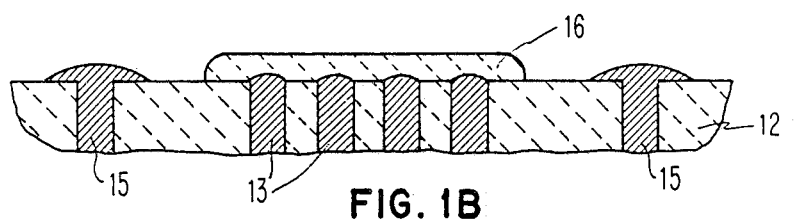
Figure 1C:
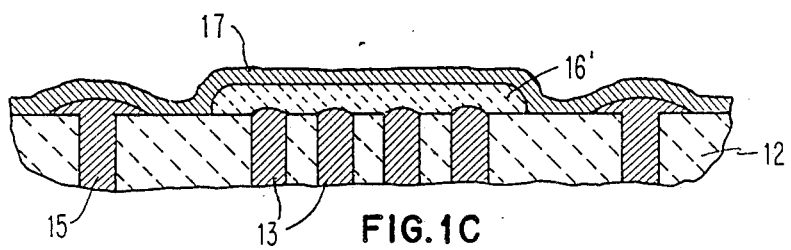
Figure 1D:
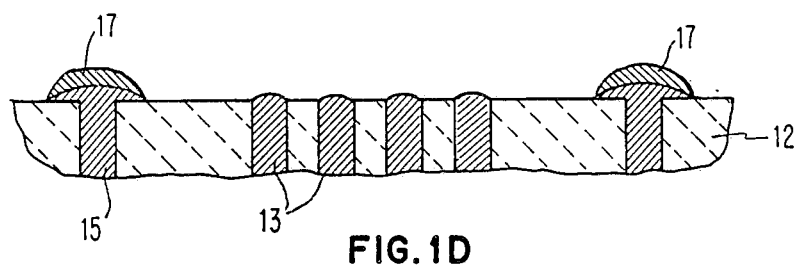
Figure 2:
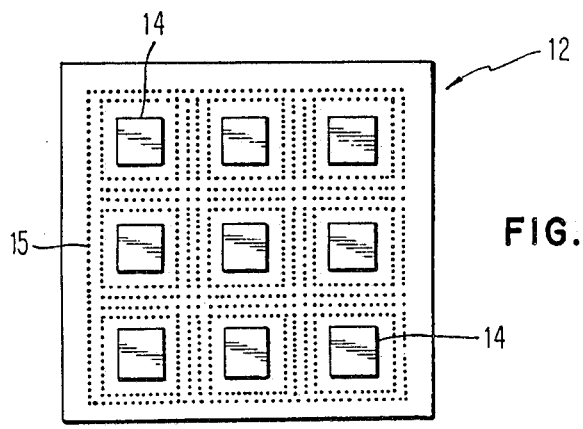
FIG. 2 is a top view of a substrate to be metallized.

The basic processing steps for a multilayer ceramic (MLC) structure are well-known and can be found in U.S. Pat. No. 3,518,756 of Bennett, et al. As illustrated in FIGS. 1 and 2, a processed, sintered MLC substrate bears patterns of exposed metallurgy on its surface. The subject invention relates to plating/metallizing the exposed metal of the patterns of metallurgy found on the substrate. The pattern of metallurgy concerned may be solely on one surface of the substrate, may be found on several surfaces and/or may penetrate many layers of the structure. The Figures illustrate in top view and in cut-away cross-section, only the surface of the metallurgy and the substrate, which are the objects of this invention. Substrate 12, as noted above, may contain several patterns of metallurgical features serving differing purposes.

In multi-layer ceramics, the metallurgical pattern on the surface is created from the via formation and screening steps and is generally a molybdenum-based metallurgy. Molybdenum does not, traditionally, provide the best adhesion qualities for soldered or brazed electrical connection. In addition, the molybdenum will oxidize the undergo reactive corrosion when exposed to humidity if not provided with a protective coating. Therefore, the molybdenum metallurgical pads are "pretreated" as is described by Kumar, et al in patent application Ser. No. 359,469 assigned to assignee of the present invention and herein incorporated by reference. Kumar, et al teaches the deposition of, for example, nickel, a metal having excellent adhesion characteristics with molybdenum, then a thin flash gold layer to prevent oxidation of the nickel. The Ni-Au treatment of all of the metallurgy pads provides both the protection and brazeable/solderable characteristics desired.

The pattern of metallurgy 13 found at locations 14 is that metal to which the integrated circuit chips will be connected, referred to as chip mounting or I/O pads. The I/O pads bear the very thin coating of protective ad conductive metal discussed above. The thin gold is necessary on the I/O pads for mounting the chips by solder bonding. The other metallurgical pattern, comprises the engineering change, EC, pads, 15, associated with the substrate. The EC pads provide alternate electrical pathways to the I/O metallurgy and the substrate by the application thereto of interconnecting wires to accommodate engineering changes, testing and defect correction. Given the repeated uses envisioned for any one EC pad, it is preferred that an additional heavy layer of gold be associated with the EC pads.

For application of the metal to the pads alone, without concurrently coating the substrate, masks have been utilized. The difficulty in using masks is that the non-uniform shrinkage of the substrate during sintering makes it virtually impossible to achieve registration of a mask with the sintered substrate.

Selective plating by electroplating may also be employed; but, it is somewhat limited in its applicability to EC pads since EC pads are frequently "floating" and cannot therefore be electrically connected for the electroplating process.

Metallization by the use of diffusion techniques as described in U.S. Pat. No. 4,442,137 of Kumar, can assure that each pad is adequately coated while metal deposited on the surrounding substrate area is easily and properly removed. The metal is applied to the entire patterned substrate surface, as by sputtering or vapor deposition. The metal-coated substrate is then heated to a temperature sufficient to diffuse the metal into the underlying pattern. Given the differing thermal contraction properties of the overlying metal and the substrate during the diffusion-heating step, the metal which is overlying non-patterned areas is caused to flake or spall and consequently is easily removed from the now metallized patterned substrate. This maskless cladding process avoids the difficulties of correct mask registration and repeated depositing, masking, and etching steps. The drawback to the process heretofore has been that the cladding process involves the entire substrate and therefore coats all metallurgy with the same materials and the same layer thicknesses. Such a scheme is highly useful for the preliminary preparation of the metallurgy, as was noted in Kumar No. 359,469 above, whereby every metallurgical pad is coated with a thin nickel and thin gold layer to enhance the pad's adhesive qualities. It is, however, of little utility for selectively applying an additional heavy metal layer to the EC pads, but not to the I/O pads.

The use of a mask to shield the I/O pads from metallization would appear to be a workable solution; however, no presently known mask can provide the requisite qualities to withstand the maskless cladding process. A metal mask, again, has the problem of alignment and registration with a sintered, cambered substrate. Resists such as well-known photoresists or E-beam resists cannot survive the deposition, e.g. sputtering, temperatures. Common lithographic materials degrade or shrivel at the processing temperatures of >250° C. reached during, for example, sputtering, and thereby fail to effectively shield the masked areas from gold deposition. In addition, most photoresists will char when heated, during the diffusion step, to above 400° C. in a reducing atmosphere. Removal of the char, or carbonaceous residue, would require additional processing steps, such as prolonged plasma ashing. The resists would, during the diffusion step, undoubtedly collapse and result in contamination of the underlying "protected" layer.

There is herein disclosed a suitable masking material enabling one to provide an isolation barrier over the I/O pads while depositing heavy gold on the EC pads and substrate using a maskless cladding process. A paste is formulated of alumina including a depolymerizable polymer binder and a solvent. The paste is screened, sprayed or otherwise selectively deposited onto the area to be protected, as illustrated in FIG. 1B at reference numeral 16. The polymer binder enables the paste to be readily applied and to adhere to the surface of the substrate and/or metallurgy to be protected. After screening, the paste is allowed to dry at room temperature to expel the solvent, followed by an accelerated drying step to drive off the polymer binder by "unzipping", or depolymerizing, the same. What remains is a durable inorganic barrier layer, 16'. The heavy metal deposition may now be performed using vapor deposition, sputtering or other known technique resulting in a continuous coating 17 over the entire substrate 12, including the metallurgy intended to be plated, here the EC pads 15 of FIG. 1C, the exposed substrate surface, and the protective coating 16'. Subsequent diffusion processing may proceed in the established manner, found in the Kumar U.S. Pat. No. 4,442,137. The isolation barrier layer, 16', has both the mechanical and thermal integrity to withstand the weight of the thick metal layer and the temperatures achieved for diffusing the metal layer to the underlying metallurgy and debonding it with the substrate. After the diffusion process is completed, the substrate is "patterned" in accordance with Kumar's teachings of U.S. Pat. No. 4,442,137. The "patterning", for example by ultrasonic horn exposure, results in the removal of the debonded or spalled metal found on the adjacent bare substrate surface, removes the overlying metal in the shielded area and also effects the removal of the inorganic barrier layer 16'. The result, as intended, is a clean substrate having selectively coated metallurgical patterns prepared for chip mounting and further connection and use.

The formulation of the isolation barrier material comprises a unique combination of ingredients to yield the thermal and mechanical characteristics desired. The inorganic base of ceramic, for example alumina or glass ceramic, must, once solvents and binders are removed, be solid and impermeable enough to support the gold or other metal layer away from the underlying protected metallurgy. The inorganic ceramic cannot effectively be deposited directly on the substrate so the depolymerizable polymer binder and solvent are mixed to form the screenable, sprayable or otherwise applicable paste. A low vapor pressure solvent, such as amylacetate, is recommended for use if the barrier material is to be applied by screening. A more volatile solvent would clog the screens during application. The polymer binder must be one of a group which is readily decomposable at a known temperature so as to depolymerize leaving no carbonaceous residue on the substrate or on the barrier layer. Examples, though not an exhaustive list of suitable polymers, include polymethylmethacrylate and other methylmethacrylates, acrylates and copolymers; polyalphamethylstyrene; polyisobutylene; and low temperature decomposing nitrocellulose or polyphthalaldehyde. As noted above, a step may be taken to heat the applied barrier layer in order to depolymerize the polymer, essentially purging the inorganic layer before metal deposition. It is, however, possible to forego that heating step. The polymer chosen, such as polymethylmethacrylate, may decompose during the diffusion step at the diffusion temperatures of 350° C.–450° C., serving the same function and leaving the organic-free ceramic particulate structure to support the heavy metal layer and isolate the underlying metallurgy. A suitable sample formulation consists of polymethylmethacrylate 6.58%
amylacetate 26.33%
alumina powder 65.83%
fumed silica 1.25%

The foregoing invention has been described with reference to a preferred embodiment. It will be understood, however, that modifications in detail may be made without departing from the spirit and scope of the invention as hereinafter claimed:

What is claimed is:

1. A diffusion barrier material having sufficient thermal and mechanical integrity to protect selected metal areas of a plurality of spaced metal areas on the surface of a substrate during maskless cladding consisting essentially of: polymethylmethacrylate, amylacetate, and a ceramic particle base comprising alumina powder and fumed silica, wherein said material has sufficient thermal and mechanical integrity to protect selected metal areas of a plurality of spaced metal areas on the surface of a substrate during maskless cladding.

2. A screenable paste to protect selected metal areas of a plurality of spaced metal areas on an alumina ceramic substrate surface during maskless cladding comprising:

polymethylmethacrylate, amylacetate and a ceramic particle base comprising alumina powder and fumed silica wherein said paste protects selected metal areas of a plurality of spaced metal areas on an alumina ceramic substrate surface during maskless cladding.

3. The barrier material of claim 1 wherein the ceramic particle base comprises a majority component of said material.

4. The paste of claim 2 wherein the ceramic particle base comprises a majority component of said paste.

* * * * *